United States Patent
Wu et al.

(10) Patent No.: US 9,839,136 B2
(45) Date of Patent: Dec. 5, 2017

(54) FABRICATION OF A FLEXIBLE CIRCUIT BOARD

(71) Applicant: TAIMIDE TECHNOLOGY INCORPORATION, Hsinchu County (TW)

(72) Inventors: Paul S. C. Wu, Hsinchu Hsien (TW); Chun-Ting Lai, Hsinchu Hsien (TW); Yen-Po Huang, Hsinchu Hsien (TW); Sheng-Yu Huang, Hsinchu Hsien (TW)

(73) Assignee: Taimide Technology Incorporation, Hsinchu County (TW)

( * ) Notice: Subject to any disclaimer, the term of this patent is extended or adjusted under 35 U.S.C. 154(b) by 0 days.

(21) Appl. No.: 15/250,595

(22) Filed: Aug. 29, 2016

(65) Prior Publication Data
US 2017/0064838 A1    Mar. 2, 2017

(30) Foreign Application Priority Data
Sep. 2, 2015   (TW) .............................. 104128995 A

(51) Int. Cl.
*H05K 1/00*   (2006.01)
*H05K 3/00*   (2006.01)
*H05K 3/02*   (2006.01)
*H05K 3/28*   (2006.01)

(52) U.S. Cl.
CPC ............. *H05K 3/007* (2013.01); *H05K 3/022* (2013.01); *H05K 3/281* (2013.01); *H05K 2201/0154* (2013.01); *H05K 2203/0264* (2013.01)

(58) Field of Classification Search
CPC ............................... H05K 3/007; H05K 1/005
See application file for complete search history.

(56) References Cited

U.S. PATENT DOCUMENTS

| | | | |
|---|---|---|---|
| 5,231,751 A * | 8/1993 | Sachdev | H01L 21/486 216/18 |
| 2009/0197999 A1* | 8/2009 | Shen | C08G 73/1046 524/166 |
| 2010/0240787 A1* | 9/2010 | Cunningham | B29C 43/003 521/183 |

\* cited by examiner

*Primary Examiner* — Jeremy C Norris
(74) *Attorney, Agent, or Firm* — Baker & McKenzie LLP

(57) ABSTRACT

The present disclosure relates, according to some embodiments, to the fabrication of a flexible circuit board, which includes forming a base layer comprising polyimide, forming a polyimide layer on the base layer, the polyimide layer having a first surface and a second surface opposite to each other, the first surface being peelably adhered in contact with the base layer, forming a metal layer on the second surface of the polyimide layer, and peeling the base layer from the polyimide layer with the metal layer remaining on the second surface of the polyimide layer.

20 Claims, 2 Drawing Sheets

FABRICATION OF A FLEXIBLE CIRCUIT BOARD

CROSS-REFERENCE TO RELATED APPLICATION(S)

This application claims priority to Taiwan Patent Application No. 104128955 filed on Sep. 2, 2015 incorporated herein by reference as if set forth in full.

BACKGROUND OF THE DISCLOSURE

1. Field of the Disclosure

The present application relates to flexible circuit boards, and in some embodiments, to ultra-thin flexible circuit boards and their fabrication methods.

2. Background

A polyimide coverlay is conventionally used in a print circuit board (PCB) to cover and protect metal circuits formed thereon. As technology advances, the printed circuit board becomes increasingly thinner, lighter and multi-functional. The thinner dimension of the printed circuit board usually requires an ultra-thin polyimide coverlay.

In the fabrication of a flexible printed circuit board, a printed circuit may also be formed on a polyimide film used as a carrier. However, technical difficulties may arise in the fabrication steps when the polyimide film becomes very thin (less than 6 μm).

Ultra-thin polyimide films are difficult to fabricate with current processing methods. Some polyimide films currently available on the market may have a thickness less than 10 μm. However, polyimide films with a thickness less than 5 μm are usually not subjected to biaxial orientation, because the stretching process may break the polyimide film. Moreover, the fabrication of the current ultra-thin polyimide films generally does not consider difficulties that may arise in the application of the polyimide film as a carrier of a flexible circuit board, which may require applying an adhesive on the ultra-thin polyimide film. When the thickness of the polyimide film is less than 6 μm, certain processing steps (such as adhesive coating) applied on the polyimide film are very difficult to perform.

Accordingly, there is a need for polyimide films that are convenient to process, and are suitable for use in fabricating ultra-thin flexible circuit boards.

SUMMARY

The present application discloses, in some embodiments, methods of fabricating a flexible circuit board. A method may comprise, for example, forming a base layer containing polyimide, forming a polyimide layer on the base layer, the polyimide layer having a first surface and a second surface opposite to each other, the first surface of the polyimide layer being peelably adhered in contact with the polyimide layer, forming a metal layer on the second surface of the polyimide layer, and peeling the base layer from the polyimide layer with the metal layer remaining on the second surface of the polyimide layer.

Moreover, the present application discloses a flexible multilayered structure including a substrate and a metal layer formed on the substrate. The substrate includes a polyimide layer and a base layer. The polyimide layer has a first surface and a second surface opposite to each other, and the base layer contains polyimide and is peelably adhered in contact with the first surface of the polyimide layer. The metal layer is formed on the second surface of the polyimide layer.

DETAILED DESCRIPTION OF THE EMBODIMENTS

Figure 1:
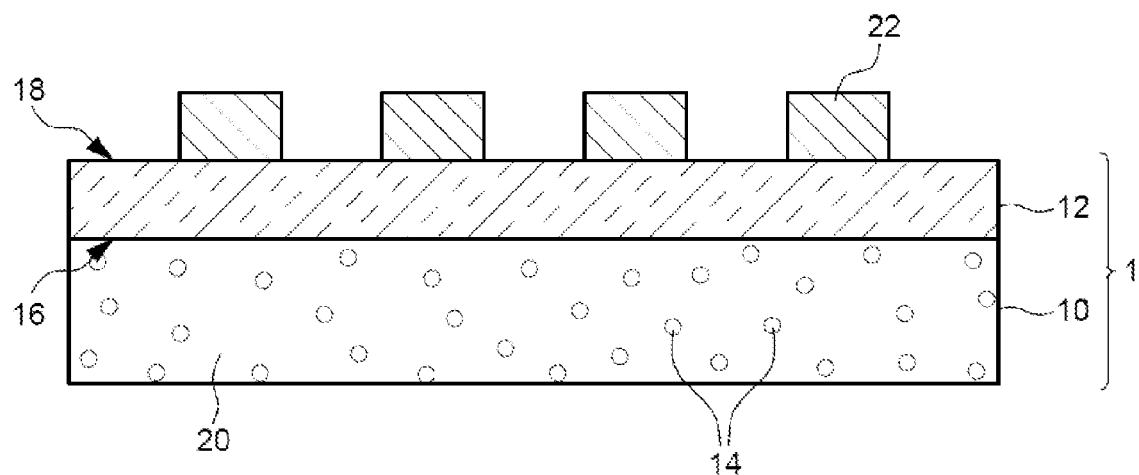
FIG. 1 is a schematic view illustrating an example embodiment of a flexible multilayered structure used in the fabrication of a flexible circuit board.
Figure 2:
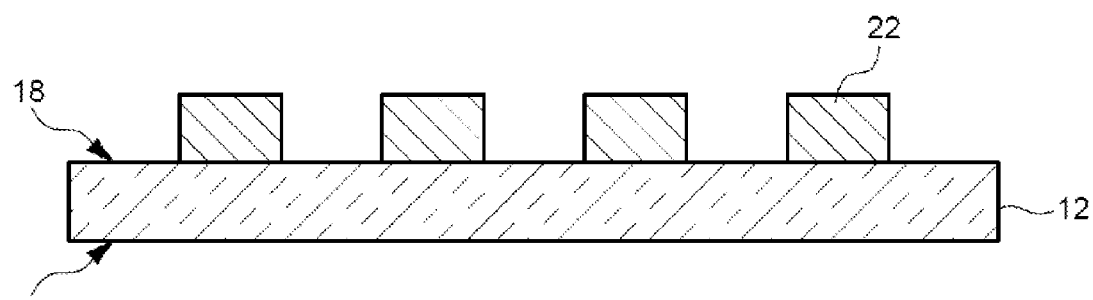
FIG. 2 is a schematic view illustrating an example embodiment of a flexible circuit board.

FIGS. 1 and 2 are schematic views illustrating a flexible multilayered structure used in the fabrication of a flexible circuit board. Referring to FIGS. 1 and 2, a flexible circuit board can be fabricated from a substrate 1 that includes a polyimide layer 12 and a base layer 10. The polyimide layer 12 can be a single layer, and can have a first surface 16 and a second surface 18 opposite to each other. The base layer 10 can be a single layer having a surface adhered in contact with the first surface 16 of the polyimide layer 12. A filler 14 in the form of polymer particles having low surface energy may be incorporated in the base layer 10, so that the polyimide layer 12 and the base layer 10 can peelably adhere and contact with each other. In one embodiment, the base layer 10 can be a single layer containing a polyimide 20 as base material. The filler 14 can be particles made of fluoropolymers having a low surface energy less than 35 dyne/cm. While the base layer 10 remains adhered to the polyimide layer 12, a metal layer 22 can be formed on the second surface of the polyimide layer 12 to form a flexible multilayered structure as shown in FIG. 1. After the metal layer 22 is formed on the second surface 18 of the polyimide layer 12, the base layer 10 can be peeled from the first surface 16 of the polyimide layer 12, leaving the polyimide layer 12 as a carrier with the metal layer 22 thereon as shown in FIG. 2.

In some embodiments, the base layer 10 or the polyimide layer 12 may contain siloxane. For example, a siloxane and a polyimide may be polymerized to form the base layer 10 or polyimide layer 12 containing siloxane. The base layer 10 or polyimide layer 12 containing siloxane can have a surface energy less than 35 dyne/cm, thereby allowing peelable adhesion between the base layer 10 and the polyimide layer 12.

The polyimide layer 12 can be an ultra-thin layer, and has a thickness equal to or less than 6 μm, e.g., between about 0.1 μm and about 5 μm. For example, the thickness of the polyimide layer 12 may be 0.1 μm, 1 μm, 2 μm, 2.5 μm, 3 μm, 4 μm, 4.5 μm, or any intermediate values falling in any ranges defined between any two ones of the aforementioned values.

The base layer 10 is not limited in thickness. In some embodiments, the thickness of the base layer 10 can be between about 5 μm and about 10 μm. In some embodiments, the base layer 10 can have a thickness higher than 10 μm. While there is no particular constraint imposed on the thickness of the base layer 10, some embodiments provide a base layer 10 that has a thickness greater than the thickness of the polyimide layer 12.

In some embodiments, the filler 14 is a fluoropolymer, which can include, without limitation, fluorinated polyalkene, fluorinated polyalkylene, fluorinated polyoxyalkylene, chlorofluorocarbons and the like.

In some embodiments, fluoropolymers used for the filler 14 may include polyvinyl fluoride (PVF), polyfluorinated vinylidene (PVDF), polytetrafluoroethylene (PTFE), fluorinated ethylene propylene (FEP), perfluoropolyether (PEPE), perfluorosulfonic acid (PFSA), perfluoroalkoxy (PFA), chlorotrifluoroethylene (CTFE) and ethylene chlorotrifuloroethylene (ECTFE), which can be used individually or in combination.

Based on the total weight of the base layer 10, the incorporated quantity of the filler 14 may be between about 45 wt % and about 60 wt %, such as 46 wt %, 48 wt %, 50 wt %, 55 wt %, 58 wt %, or any intermediate values falling in any ranges defined between any two ones of the aforementioned values. In some various embodiments, exemplary ranges of the filler 14 incorporated in the base layer 10 can include 45 wt % to 55 wt %, 55 wt % to 60 wt %, and 47 wt % to 57 wt %.

The filler 14 may be in the form of powder having an average particle diameter or size equal to or less than 20 µm, e.g., 0.5 µm, 1 µm, 2.5 µm, 5 µm, 7.5 µm, 10 µm, 12.5 µm, 15 µm, 17.5 µm, 19 µm, 20 µm, or any intermediate values falling in any ranges defined between any two ones of the aforementioned values. In some embodiments, the average particle diameter of the filler 14 can be between about 5 µm and about 15 µm. In some variant embodiments, the average particle diameter of the filler 14 can be between about 2 µm and about 8 µm. In some embodiments, the average particle diameter of the filler 14 can be between about 11 µm and about 20 µm, preferably between 12 µm and 18 µm. In some embodiments, the average particle diameter of the filler 14 can be between 6 µm and 15 µm.

By incorporating a suitable amount of a filler having low surface energy (e.g., less than about 35 dyne/cm), the base layer 10 can exhibit reduced surface tension so that the adhesiveness of the base layer 10 to the polyimide layer 12 is reduced. However, the addition of the filler having low surface energy still allows the base layer 10 to have a desirable surface tension, so that the polyimide layer 12 can be directly formed on a surface of the base layer 10. The ability to easily remove the base layer 10 can be advantageously used in certain applications of the polyimide layer 12. For example, after the metal layer 22 (e.g., copper foil) is formed on the second surface 18 of the polyimide layer 12 for fabricating a flexible circuit board, the base layer 10 can be easily peeled from the first surface 16 of the polyimide layer 12 without breaking the polyimide layer 12 or causing separation of the metal layer 22 from the polyimide layer 12. The attachment of the metal layer 22 to the polyimide layer 12 thus can be effectively maintained in the fabricated flexible circuit board.

While the illustrated embodiment shows the filler 14 being incorporated in the base layer 10 only, alternate embodiments may incorporate the same filler 14 in the polyimide layer 12 rather than in the base layer 10 to achieve similar peelable adhesion between these two layers.

In some embodiments, a peeling strength between the base layer 10 and the polyimide layer 12 is less than about 0.15 kgf/cm (kilogram-force per cm), e.g., 0.14 kgf/cm, 0.12 kgf/cm, 0.10 kgf/cm, 0.05 kgf/cm, or any intermediate values falling in any ranges defined between any two ones of the aforementioned values. The aforementioned ranges of the peeling strength between the base layer 10 and the polyimide layer 12 reflects the peelable adhesion of the base layer 10 to the polyimide layer 12.

In at least one embodiment, the base layer 10 further has a water contact angle higher than 40°, e.g., 50°, 60°, 75°, 90°, 120°, 150°, 180°, or any intermediate values falling in any ranges defined between any of the aforementioned values.

Referring to FIG. 1, a method of fabricating the substrate 1 having a flexible multilayered structure includes forming the base layer 10 containing the polyimide 20 and the filler 14 having low surface energy, coating a layer of polyamic acid solution on a surface of the base layer 10, and then heating the polyamic acid solution to form the polyimide layer 12, the polyimide layer 12 thereby formed being peelably adhered to the base layer 10.

For forming the base layer 10, diamine and dianhydride monomers can be reacted in a solution to obtain a first polyamic acid solution. Then the filler 14 having low surface energy is added and mixed homogenously in the first polyamic acid solution. A layer of the first polyamic acid solution thereby obtained is coated on a support plate and then heated at a temperature between about 90° C. and about 350° C. to form the base layer 10.

For forming the polyimide layer 12, diamine and dianhydride monomers can be reacted in a solution to obtain a second polyamic acid solution. The diamine and dianhydride monomers used for the polyimide layer 12 can be the same, partly the same, or different from the diamine and dianhydride monomers used for forming the base layer 10. Optionally, one or more additives can be incorporated in the second polyamic acid solution, such as color pigments, matting agents and the like. A layer of the second polyamic acid solution is coated on the base layer 10 and then heated at a temperature between about 90° C. and about 350° C. to form the polyimide layer 12 on the base layer 10. Preferably, the formed polyimide layer 12 has a thickness between 0.1 µm and 5 µm.

In certain embodiments, the substrate 1 comprised of the base layer 10 and the polyimide layer 12 can further undergo a biaxial stretching process so that both the base layer 10 and the polyimide layer 12 are biaxially oriented, e.g., along the lengthwise and transversal directions of the multilayered substrate. This can enhance the strength of the substrate 1.

Conventionally, it is more difficult to apply biaxial stretching for thinner films without causing break damages, and most ultra-thin polyimide films generally are not subjected to biaxial stretching. Because it is formed with the ultra-thin polyimide layer 12 directly adhered to the base layer 10, the substrate 1 described herein can have a suitable thickness so that the biaxial stretching process can be applied without breaking the ultra-thin polyimide layer 12.

The substrate 1 comprised of the base layer 10 and the polyimide layer 12 may be formed by thermal conversion or chemical conversion. When chemical conversion is used, a dehydrant or a catalyst can be added into the polyamic acid solution before the coating step. Any suitable solvent, dehydrating agent and catalyst may be used. Example of solvents can include dimethylacetamide (DMAC), N,N'-dimethylformamide (DMF), N-methyl-2-pyrrolidone (NMP), dimethyl sulfoxide (DMSO), tetramethylene sulfone, N,N'-dimethyl-N,N'-propylene urea (DMPU), and any combinations thereof. Dehydrating agents may include aliphatic anhydrides (e.g., acetic anhydride and propionic anhydride), aromatic anhydrides (e.g., benzoic acid anhydride and phthalic anhydride), and any combinations thereof.

Examples of catalysts may include heterocyclic tertiary amines (e.g., picoline, and pyridine), aliphatic tertiary amines (e.g., trimethylamine (TEA)), aromatic tertiary amines, and any combinations thereof. The molar ratio of polyamic acid:dehydrating agent:catalyst is about 1:2:1, in other words for each mole of polyamic acid solution, about 2 moles of dehydrating agent and about 1 mole of catalyst are used.

In at least one embodiment, the polyimide can be derived from diamine monomer and dianhydride monomers at a substantially equal molar ratio, e.g., the diamine-to-dianhydride molar ratio may be 1:1, 0.9:1.1 or 0.98:1.02.

The polyimide 20 of the base layer 10 and that of the polyimide layer 12 can be formed by reacting diamine monomers with dianhydride monomers. Examples of suitable diamine monomers can include 4,4'-oxydianiline (4,4'-ODA), phenylenediamine (p-PDA), 2,2'-Bis(trifluoromethyl)benzidine (TFMB), 1,3-bis(4-aminophenoxy)benzene (TPER), 1,4-bis(4-aminophenoxy)benzene (TPEQ), 2,2'-dimethyl-4,4'-diaminobiphenyl (m-TB-HG), 1,3'-Bis(3-aminophenoxy)benzene (APBN), 3,5-Diaminobenzotrifluoride (DABTF), 2,2'-bis[4-(4-aminophenoxy)phenyl]propane (BAPP), 6-amino-2-(4-aminophenyl)benzoxazole (6PBOA), or 5-amino-2-(4-aminophenyl)benzoxazole (5PBOA), which can be used individually or in combination.

Examples of suitable dianhydride monomers can include 3,3',4,4'-biphenyl-tetracarboxylic dianhydride (BPDA), 2,2-bis [4-(3,4dicarboxyphenoxy) phenyl] propane dianhydride (BPADA), pyromellitic dianhydride (PMDA), 2,2'-Bis-(3,4-Dicarboxyphenyl) hexafluoropropane dianhydride (6FDA), 4,4-Oxydiphthalic anhydride (ODPA), Benzophenonetetracarboxylic dianhydride (BTDA), or 3,3',4,4'-dicyclohexyl-tetracarboxylic acid dianhydride (HBPDA), which can be used individually or in combination.

In some embodiments, the diamine monomers used for forming the polyimide 20 of the base layer 10 can include 4,4'-ODA, p-PDA, or TFMB, which can be used individually or in combination. Moreover, the dianhydride monomers used for forming the polyimide 20 of the base layer 10 can include PMDA, BPDA, or BPADA, which can be used individually or in combination.

The diamine and dianhydride monomers used for forming the polyimide layer 2 can be similar, partly similar, or different from those used for forming the base layer 1. In some embodiments, the diamine monomers used for forming the polyimide layer 12 can include 4,4'-ODA, p-PDA, or TFMB, which can be used individually or in combination. Moreover, the dianhydride monomers used for forming the polyimide layer 12 can include PMDA, BPDA, or BPADA, which can be used individually or in combination.

Figure 3:
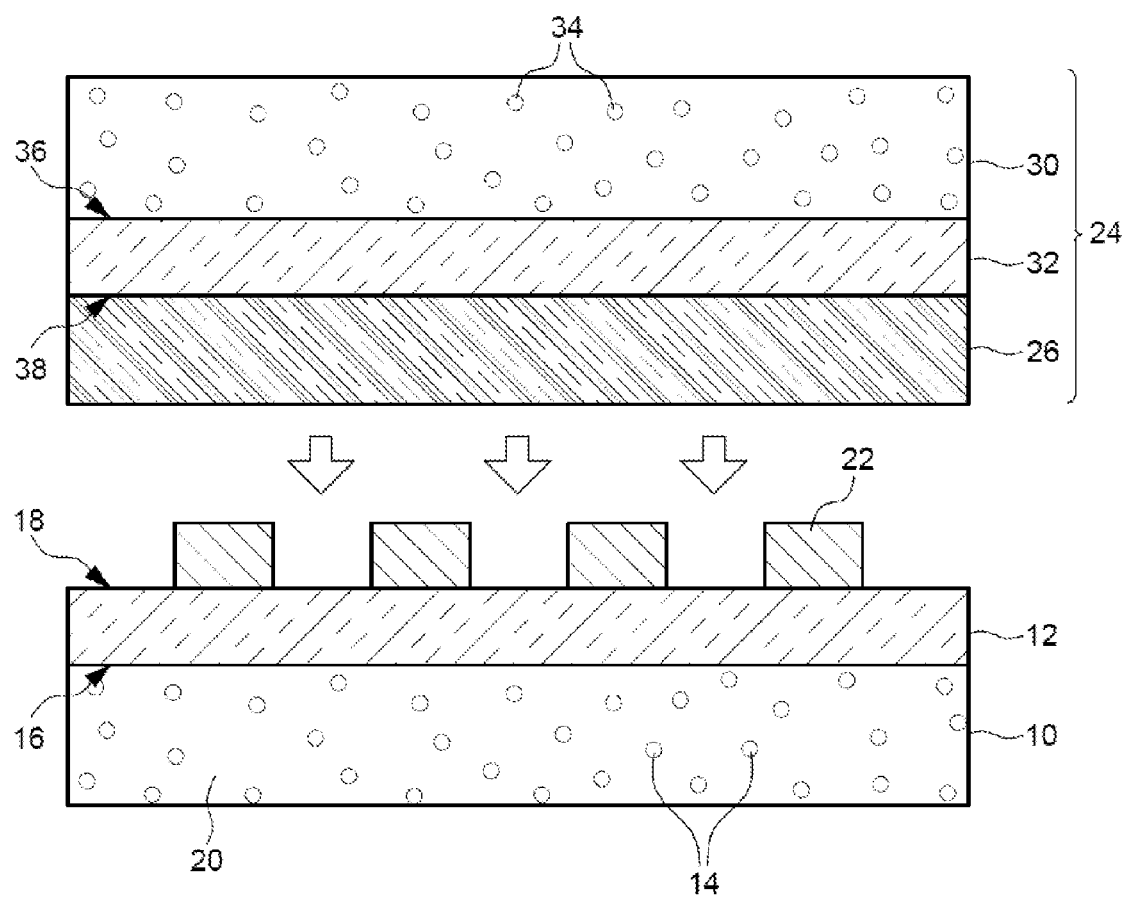
FIG. 3 is a schematic view illustrating an example embodiment of a flexible multilayered structure used in the fabrication of a flexible circuit board.
Figure 4:
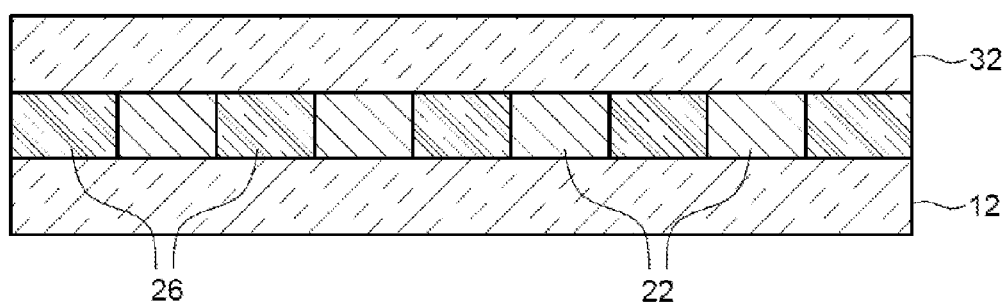
FIG. 4 is a schematic view illustrating an example embodiment of a flexible circuit board.

FIGS. 3 and 4 are schematic views illustrating some embodiments in which a protective layer structure 24 can be further provided in the fabrication of a flexible circuit board. The protective layer structure 24 can include a polyimide layer 32, a base layer 30 and an adhesive layer 26. The polyimide layer 32 can be a single layer having two opposite surfaces 36 and 38. In some embodiments, the polyimide layer 32 may have a thickness in the same range as the thickness of the polyimide layer 12 described previously. The base layer 30 can be a single layer that is adhered in contact with the surface 36 of the polyimide layer 32. The base layer 30 can be similar to the base layer 10 described previously, and contain a polyimide and a filler 34 having a low surface energy to facilitate its peeling from the polyimide layer 32. The filler 34 incorporated in the base layer 30 can be similar to the filler 14 contained in the base layer 10. In this manner, the adhesion between the base layer 30 and the polyimide layer 32 can have similar characteristics (such as peeling strength) as the adhesion between the base layer 10 and the polyimide layer 12 described previously.

The adhesive layer 26 can be applied on the surface 38 of the polyimide layer 32. After the metal layer 22 is formed on the substrate 1 comprised of the base layer 10 and the polyimide layer 12 adhered to each other, the protective layer structure 24 can be attached to the side of the substrate 1 provided with the metal layer 22 via the adhesive layer 26. Then the base layers 10 and 30 can be peeled off to obtain a substantially thin flexible circuit board having the polyimide layer 32 serving as a protection layer covering the metal layer 22, as shown in FIG. 4.

Examples of methods of fabricating the aforementioned ultrathin flexible circuit boards are described hereinafter.

EXAMPLES

In some embodiments, about 52.63 g (grams) of 4,4'-oxydianiline (4,4'-ODA) and about 440 g of dimethylacetamide (DMAC) used as a solvent are put into a three-necked flask, and agitated at a temperature of about 30° C. until complete dissolution. Then about 57.37 g of pyromellitic dianhydride (PMDA) is added. The quantity of the reacted monomers is 20 wt % of the total weight of the solution. The solution is continuously agitated and reaction occurs at a temperature of 25° C. for 20 hours to form a first polyamic acid (PAA) solution. About 100 g of PTFE powder (i.e., corresponding to about 45 wt % of the total weight of the polyimide film) is added into the first PAA solution and mixed homogeneously, and acetic anhydride and picoline are added as catalyst into the first PAA solution (the molar ratio of polyamic acid:acetic anhydride:picoline is about 1:2:1). The first PAA solution thereby obtained is coated onto a glass plate and heated at a temperature of 80° C. for 30 minutes to remove most of the solvent. Then, the glass plate with the coated first PAA solution thereon is placed in an oven and heated at a temperature of 170° C. for 1 hour to form the base layer 10.

The ultrathin polyimide layer 12 is prepared with similar steps. About 52.63 g of 4,4'-ODA and about 57.37 g of PMDA are used to prepare the second PAA solution, and the quantity of the reacted monomers is 20 wt % of the total weight of the solution. The second PAA solution is coated onto the base layer 10 and heated at a temperature of 80° C. for 30 minutes.

The obtained wet substrate comprised of the base layer 10 and the ultrathin polyimide layer 12 then is extracted, and affixed on a stretching machine having pin plates on four corners to undergo biaxial stretching. The wet substrate 1 has an initial width $L_{0x}$ and an initial length $L_{0y}$, which respectively become a width $L_x$ and a length $L_y$ after stretching. A width stretching rate $\epsilon_x$ can be defined as the expression $(L_x-L_{0x})/L_{0x}$, and a length stretching rate $\epsilon_y$ can be defined as the expression $(L_y-L_{0y})/L_{0y}$. In some embodiment, $\epsilon_x$ and $\epsilon_y$ can be respectively equal to 40%.

After the biaxial stretching process is completed, the wet substrate is heated at a temperature between 170 and 370° C. for 4 hours. The final substrate 1 comprised of the base layer 10 and the polyimide layer 12 thereby formed has a total thickness equal to about 27.5 μm, the thickness of the base layer 10 being about 25 μm and the thickness of the polyimide layer 12 being about 2.5 μm.

Test of Sample Film Properties

Measure of Water Contact Angle:

A sessile drop technique (DSA10-MK2, Kruss) is applied to measure the water contact angle. A light beam is projected on a water drop, which is imaged by a charge coupling device (CCD) sensor on a monitor. An analysis program is then run to calculate the contact angle of the water drop. The error tolerance of the calculation is ±5°.

Test of Peeling Strength:

A copper foil having a thickness of 18 μm is pressed and adhered to the outer surface of the polyimide layer 12 of the substrate 1. Testing of the peeling strength is then conducted with a universal testing machine (Hounsfield H10ks) according to IPC-TM650 2.4.9 test method. It is then verified that peeling occurs at the interface between the base layer 10 and the polyimide layer 12.

The water contact angle of the substrate 1 prepared with the aforementioned example is about 45°, and the peeling strength between the base layer 10 and the ultrathin polyimide layer 12 is about 0.14 kgf/cm.

Comparative Example 1

A substrate is prepared as described previously, except that the PTFE powder incorporated in the first PAA solution is 42.4 g (i.e., 30 wt % based on the total weight of the base layer 10).

The substrate prepared according to Comparative Example 1 has a water contact angle equal to 32°, and a peeling strength between the base layer and the polyimide layer equal to 0.5 kgf/cm. The higher peeling strength of the substrate fabricated according to Comparative Example 1 means that the polyimide layer cannot be easily separated from the base layer.

Comparative Example 2

A substrate is prepared as described previously, except that the PTFE powder incorporated in the first PAA solution is 231 g (i.e., 70 wt % based on the total weight of the base layer).

In Comparative Example 2, no polyimide layer can be formed on the base layer. This is because the fluorine content in the base layer is too high, which results in a excessively low surface energy of the base layer.

The substrate described herein can bring several advantages over conventional polyimide films. For example, the smallest thickness of a conventional polyimide film prepared with biaxial stretching is generally about 10 μm (with no base layer). If the polyimide film were to be formed with a thickness less than 10 μm, the conventional processing method requires to laminate the thinner polyimide film on a polyester tape (e.g., PET tape), and then wind the assembly of the polyimide film and the PET tape to form a roll. Unlike the conventional polyimide film assembly, the substrate described herein can accommodate an ultra-thin polyimide layer that is less than 5 μm in thickness, and allow biaxial stretching of the ultra-thin polyimide layer without incurring damages.

Moreover, the substrate described herein can be used for fabricating a flexible circuit board, the base layer providing effective support for carrying out processing steps such as adhesive application on the ultra-thin polyimide layer. After all the requisite processing steps on the polyimide layer are completed, the base layer can be easily removed to achieve a substantially thin product. Accordingly, the substrate as described herein can facilitate the fabrication process at an economical cost.

Realizations of the film structures and methods of fabrication have been described in the context of particular embodiments. These embodiments are meant to be illustrative and not limiting. Many variations, modifications, additions, and improvements are possible. These and other variations, modifications, additions, and improvements may fall within the scope of the invention as defined in the claims that follow.

What is claimed is:

1. A flexible multilayered structure comprising:
    a substrate including a polyimide layer and a base layer, the polyimide layer being a single layer having a first surface and a second surface opposite to each other, and the base layer being a single layer comprising polyimide and being peelably adhered in contact with the first surface of the polyimide layer; and
    a metal layer formed on the second surface of the polyimide layer.

2. The flexible multilayered structure according to claim 1, wherein the polyimide layer or the base layer has a surface energy less than 35 dyne/cc.

3. The flexible multilayered structure according to claim 1, wherein a peel strength between the base layer and the polyimide layer is less than 0.15 kgf/cm.

4. The flexible multilayered structure according to claim 1, wherein the base layer or the polyimide layer comprises a filler having a surface energy less than 35 dyne/cc, the filler being comprised of particles having an average particle size equal to or less than 20 μm.

5. The flexible multilayered structure according to claim 4, wherein the filler is selected from the group consisting of polyvinyl fluoride (PVF), polyfluorinated vinylidene (PVDF), polytetrafluoroethylene (PTFE), fluorinated ethylene propylene (FEP), perfluoropolyether (PEPE), perfluorosulfonic acid (PFSA), perfluoroalkoxy (PFA), chlorotrifluoroethylene (CTFE) and ethylene chlorotrifuloroethylene (ECTFE).

6. The flexible multilayered structure according to claim 4, wherein the filler is present in a quantity between 45 wt % and 60 wt % based on a total weight of the base layer.

7. The flexible multilayered structure according to claim 1, wherein the base layer or the polyimide layer comprises siloxane.

8. The flexible multilayered structure according to claim 1, further comprising:
    a protective layer structure including a second polyimide layer and a second base layer, the second base layer being peelably adhered in contact with the second polyimide layer, and the second polyimide layer being attached to the metal layer via an adhesive layer.

9. The flexible multilayered structure according to claim 8, wherein the second base layer has a surface energy less than 35 dyne/cc.

10. The flexible multilayered structure according to claim 8, wherein a peel strength between the second base layer and the second polyimide layer is less than 0.15 kgf/cm.

11. The flexible multilayered structure according to claim 8, wherein the second base layer comprises a filler having a surface energy less than 35 dyne/cc, the filler comprising particles having an average particle size equal to or less than 20 μm.

12. A method of fabricating a flexible circuit board, comprising:
    forming a base layer, the base layer being a single layer comprising polyimide;
    forming a polyimide layer on the base layer, the polyimide layer being a single layer having a first surface and a second surface opposite to each other, the first surface being peelably adhered in contact with the base layer;

forming a metal layer on the second surface of the polyimide layer; and peeling the base layer from the polyimide layer with the metal layer remaining on the second surface of the polyimide layer.

13. The method of claim 12, wherein the polyimide layer or the base layer has a surface energy less than 35 dyne/cc.

14. The method according to claim 12, wherein the base layer or the polyimide layer comprises a filler having a surface energy less than 35 dyne/cc, the filler being comprised of particles having an average particle size equal to or less than 20 μm.

15. The method according to claim 12, wherein the filler is selected from the group consisting of polyvinyl fluoride (PVF), polyfluorinated vinylidene (PVDF), polytetrafluoroethylene (PTFE), fluorinated ethylene propylene (FEP), perfluoropolyether (PEPE), perfluorosulfonic acid (PFSA), perfluoroalkoxy (PFA), chlorotrifluoroethylene (CTFE) and ethylene chlorotrifuloroethylene (ECTFE).

16. The method according to claim 12, wherein the base layer or the polyimide layer comprises siloxane.

17. The method according to claim 12, wherein while the base layer remains adhered to the polyimide layer, the method further comprises:

providing a protective layer structure including a second polyimide layer and a second base layer, the second base layer being peelably adhered in contact with the second polyimide layer; and while the second base layer remains adhered to the second polyimide layer, attaching the second polyimide layer of the protective layer structure to the metal layer via an adhesive layer.

18. The method according to claim 17, further comprising:

in addition to peeling the base layer from the polyimide layer, peeling the second base layer from the second polyimide layer after the second polyimide layer is attached to the metal layer.

19. The method according to claim 17, wherein the second base layer comprises polyimide and a second filler having a surface energy less than 35 dyne/cc, the second filler being comprised of particles having an average particle size equal to or less than 20 μm.

20. The method according to claim 17, wherein a peel strength between the second base layer and the second polyimide layer is less than 0.15 kgf/cm.

* * * * *